US009007239B1

(12) United States Patent
Lissack et al.

(10) Patent No.: US 9,007,239 B1
(45) Date of Patent: Apr. 14, 2015

(54) REDUCTION OF MEMORY CONSUMPTION

(75) Inventors: Yaron Lissack, Great Neck, NY (US);
Saldy Antony, Santa Clara, CA (US);
Mark S. Urbanus, San Jose, CA (US)

(73) Assignee: Amazon Technologies, Inc., Reno, NV (US)

( * ) Notice: Subject to any disclaimer, the term of this patent is extended or adjusted under 35 U.S.C. 154(b) by 339 days.

(21) Appl. No.: 13/540,241

(22) Filed: Jul. 2, 2012

(51) Int. Cl.
*H03M 7/30* (2006.01)
*G06F 9/44* (2006.01)

(52) U.S. Cl.
CPC .............. *G06F 9/4418* (2013.01); *H03M 7/30* (2013.01)

(58) Field of Classification Search
CPC .. G06F 12/0253; G06F 1/3203; G06F 9/4418
USPC .................. 341/50, 51, 87; 718/104; 711/100
See application file for complete search history.

(56) References Cited

U.S. PATENT DOCUMENTS

| 5,617,552 | A  | * | 4/1997 | Garber et al. .................... 711/1 |
| 5,968,149 | A  | * | 10/1999 | Jaquette et al. ................ 710/68 |
| 8,166,260 | B2 | * | 4/2012 | Prabhu et al. ................. 711/161 |
| 8,539,503 | B2 | * | 9/2013 | Homma ........................ 718/104 |
| 2003/0061457 | A1 | * | 3/2003 | Geiger et al. ................. 711/154 |
| 2008/0005190 | A1 | * | 1/2008 | Fey et al. ..................... 707/202 |

OTHER PUBLICATIONS

Richard, D.; How to; circa Jan. 1996, Hosted: Ambrosia Software, URL http://www.ambrosiasw.com/ambrosia_times/january_96/3.1HowTo.html.*

* cited by examiner

*Primary Examiner* — Howard Williams
(74) *Attorney, Agent, or Firm* — Sutherland Asbill & Brennan LLP

(57) ABSTRACT

Described herein are systems and methods of reducing memory consumption in a device. The device may be resource constrained such as having limited memory, processor, power, or other resources for execution of applications. An application may be transitioned to a background state and at least a portion of the data associated with that application may be compressed, freeing up memory. While in the background state, notifications from other applications may be processed by a notification module on behalf of the application in the background state.

19 Claims, 14 Drawing Sheets

REDUCTION OF MEMORY CONSUMPTION

BACKGROUND

Devices such as user devices, embedded devices, and so forth may be constrained such as having limited memory, processor, power, or other resources for execution of applications. Insufficient memory to execute applications may result in undesirable behavior of the device.

Figure 1:
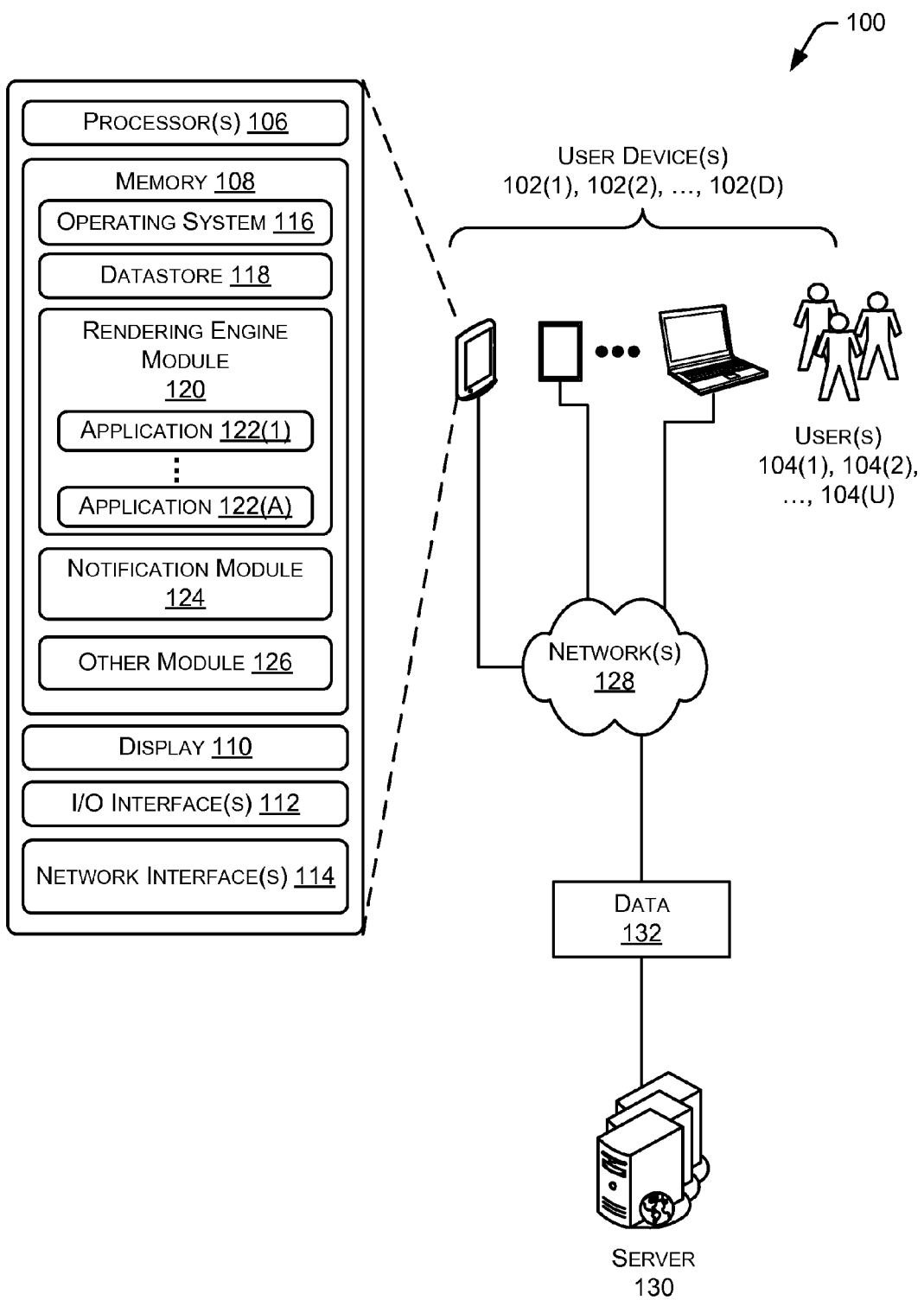
FIG. 1 illustrates a system for reducing memory consumption of an application in a background state.

Certain implementations are described below in more detail with reference to the accompanying figures, in which various implementations, aspects, or both, are shown. However, various aspects may be implemented in many different forms and should not be construed as limited to the implementations set forth herein. Like numbers refer to like elements throughout.

DETAILED DESCRIPTION

Devices processing data may range in capability from supercomputers with significant resources such as processing capacity, memory, and power, to devices such as user devices or embedded controllers with relatively limited resources. The devices may thus be considered constrained. Operation within these constraints, particularly when multiple applications are made available for use, may be maintained by transitioning applications between foreground and background states. While in the foreground state, the application remains able to accept input and provide output and consumes resources such as processing capacity, memory, and power. In comparison, when in a background state the application may be performing a previously initiated action such as playing a music file, or be dormant or inactive until being restored to the foreground. The applications in the background state may thus be incapable of receiving communications without significant modification by a programmer.

Described herein are devices and techniques for compressing data associated with an application in a background state and also delivering notifications to the application. While in the background state, portions of the data associated with the application may be compressed into a compressed resource image to reduce overall memory footprint of the application. The notifications associated with the application may be generated from events such as when data is received for the application, a timer event for the application fires, receipt of an incoming message for the application, and so forth. While in the background state, a notification module is configured to receive notifications for or on behalf of the application. The notification module may then generate event notifications to send to the application, or to a rendering engine module within which the application is executing. For example, in one implementation the application may be executing within a rendering engine module configured to render hypertext markup language (HTML) version 5 or greater and the application comprises a file comprising one or more HTML version 5 (or greater) tags. The application may also comprise associated resources such as video files, image files, audio files, scripts, and so forth. The event notification may be sent to the HTML 5 rendering engine module which may then transition the application from the background state to a foreground state by decompressing the compressed resource image, restoring the data to the memory, and then passing along the event notification for processing.

The techniques described herein provide improved capabilities for applications to remain ready for use while reducing memory consumption, remain responsive to input, and do not require special programming on the part of the applications to take advantage of. These capabilities may be provided to devices ranging from embedded controllers to user devices. The embedded controllers may be found in many applications ranging from automotive, industrial process control, home automation, and so forth. The user devices may include electronic book ("e-Book") reader devices, desktop computers, portable computers, smartphones, tablet computers, and so forth.

Illustrative System

FIG. 1 illustrates a system 100 for delivering notifications to an application in a background state with compressed data. One or more user devices 102(1), 102(2), ... 102(D) may be used by one or more users 104(1), 104(2), ..., 104(U). As used herein, letters enclosed by parenthesis such as "(D)" indicate an integer having a value greater than zero. The user devices 102 may include e-Book reader devices, laptops, desktops, tablet computers, televisions, set-top boxes, game consoles, and so forth. The techniques described herein may also be used with other devices, such as embedded devices. The user devices 102 are described in more detail below.

The user device 102 may comprise one or more processors 106, one or more memories 108, one or more displays 110, one or more input/output ("I/O") interfaces 112, and one or more network interfaces 114. The user device 102 may include other devices not depicted, such as global positioning system receivers, cameras, keyboards, and so forth.

The processor 106 may comprise one or more cores and is configured to access and execute at least in part instructions stored in the one or more memories 108. The one or more memories 108 comprise one or more computer-readable storage media ("CRSM"). The one or more memories 108 may include, but are not limited to, random access memory ("RAM"), flash RAM, magnetic media, optical media, and so forth. The one or more memories 108 may be volatile in that information is retained while providing power or non-volatile in that information is retained without providing power.

The one or more displays 110 are configured to present visual information to the user 104. The display 110 may comprise an emissive or reflective display configured to present images. An emissive display emits light to form an image. Emissive displays include, but are not limited to, backlit liquid crystal displays, plasma displays, cathode ray tubes, light emitting diodes, image projectors, and so forth. Reflective displays use incident light to form an image. This incident light may be provided by the sun, general illumination in the room, a reading light, and so forth. Reflective displays include, but are not limited to, electrophoretic displays, interferometric displays, cholesteric displays, and so forth. The one or more displays 110 may be configured to present images in monochrome, color, or both. In some implementations, the one or more displays 110 of the user device 102 may use emissive, reflective, or combination displays with emissive and reflective elements.

The one or more I/O interfaces 112 may also be provided in the user device 102. These I/O interfaces 112 allow for coupling devices such as keyboards, joysticks, touch sensors, cameras, microphones, speakers, haptic output devices, external memories, and so forth to the user device 102. The devices coupled to the I/O interfaces 112 may be configured to generate notifications, such as when data is received from a touch sensor.

The one or more network interfaces 114 provide for the transfer of data between the user device 102 and another device directly such as in a peer-to-peer fashion, via a network, or both. The network interfaces 114 may include, but are not limited to, personal area networks ("PANs"), wired local area networks ("LANs"), wireless local area networks ("WLANs"), wireless wide area networks ("WWANs"), and so forth. The network interfaces 114 may utilize acoustic, radio frequency, optical, or other signals to exchange data between the user device 102 and another device such as an access point, a host computer, a server, another user device 102, and the like.

The one or more memories 108 may store instructions for execution by the processor 106 to perform certain actions or functions. These instructions may include an operating system module 116 configured to manage hardware resources such as the I/O interfaces 112 and provide various services to applications or modules executing on the processor 106. The one or more memories 108 may also store a datastore 118, a rendering engine module 120, one or more applications 122(1), 122(2), . . . , 122(A), a notification module, and one or more other modules 126. While described as individual modules herein, it is understood that the functions and operations of various modules may be merged, distributed, and so forth.

The datastore 118 is configured to store information such as configuration files, user information, virtual memory information, and so forth. The rendering engine module 120 is configured to execute one or more of the applications 122. The rendering engine module 120 is configured to execute one or more of the applications 122(1)-122(A). These applications 122(A) may provide a variety of functionality, including SMS clients, email clients, mapping applications, timers, and so forth. The application 122 may comprise instructions in a markup language file stored in the memory 108. These instructions in the markup language file may then be processed or interpreted to execute the application 122. The rendering engine module 120 may manage the execution of the application 122, handle memory allocation, determine when to transition an application 122 between a foreground state and a background state, and compress data associated with the applications 122 which are in the background state. The rendering engine module 120 is discussed below with regard to FIG. 2 in more detail.

The notification module 124 is configured to receive and process notifications for or on behalf of the applications 122 which are in the background state. When transitioning to the background state, the notification module 124 may be configured to register handlers such that the notification module 124 acts for the application 122. The notification module 124 is discussed below in more detail with regard to FIG. 3.

Other modules 126 may be present in the one or more memories 108. These other modules 126 may comprise drivers for I/O devices coupled to the I/O interfaces 112, another rendering engine module, virtual private networking software, and so forth.

The user device 102 may couple to a network 128 via the network interface 114. The network 128 may in turn couple to a server 130. The user device 102 and the server 130 may exchange data 132 via the network 128. The data 132 may include email messages, short message service ("SMS") messages, applications 122, and so forth. The network 128 may include, but is not limited to, the Internet, a private network, a virtual private network, a wireless wide area network, a local area network, a metropolitan area network, a telephone network, and so forth.

Figure 2:
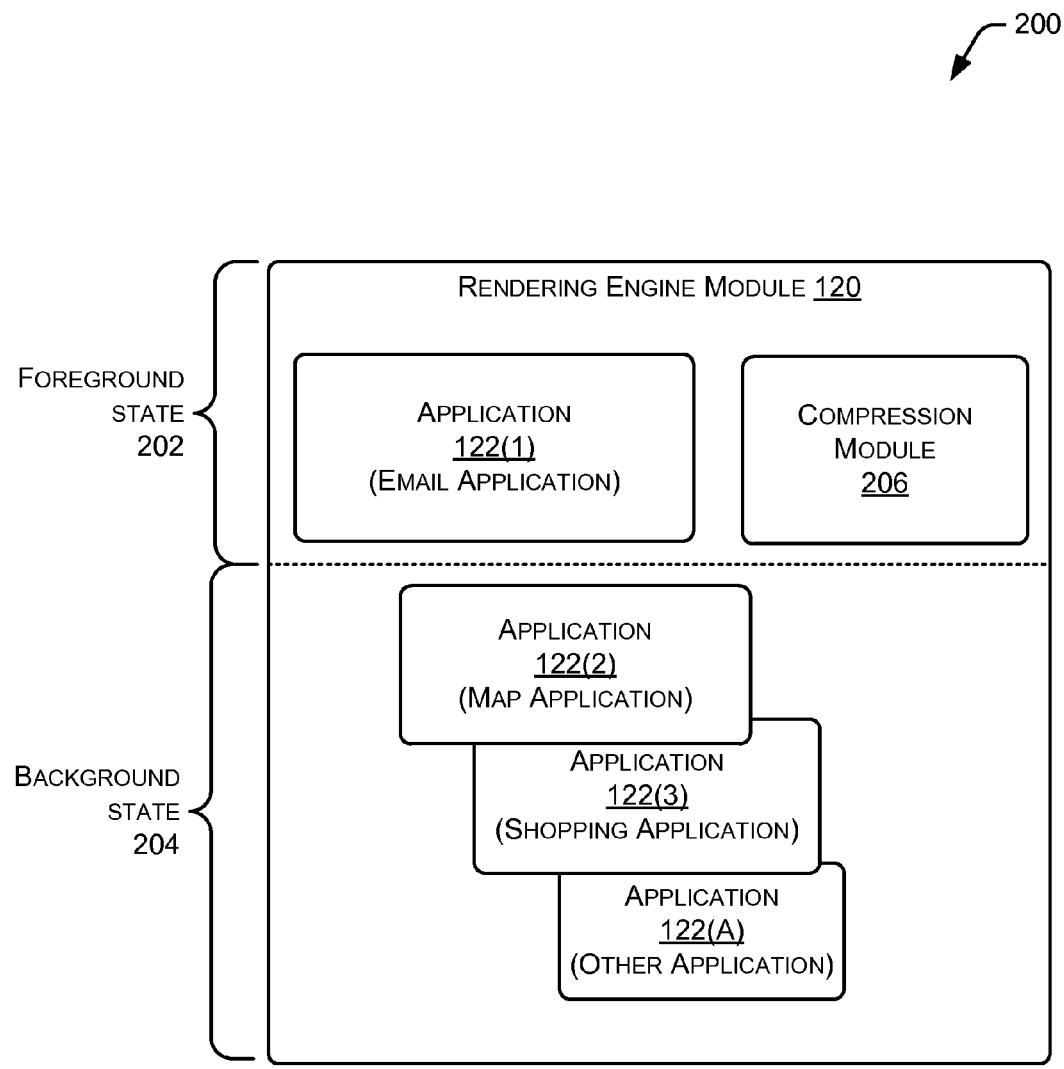
FIG. 2 illustrates a block diagram of a rendering engine module and application executing therein in a foreground state and a background state.

FIG. 2 illustrates a block diagram 200 of the rendering engine module 120. The rendering engine module 120 is configured to process one or more files comprising a markup language and present information to a user 104. The rendering engine module 120 may be configured to process HTML version 5 ("HTML5") or greater applications 122. In one implementation, the rendering engine module 120 may comprise WebKit™ as provided by the WebKit™ Open Source project available at www.webkit.org under the LGPL and BSD licenses by Apple, Incorporated of Cupertino, Calif. These applications 122 may be configured to execute in a standalone fashion on the user device 102, in conjunction with the server 130, or a combination thereof.

The rendering engine module 120 may provide individual virtual machines within which each application 122 may execute. For example, the rendering engine module 120 may execute the application 122(1) in a first virtual machine, separate from the application 122(2) executing in a second virtual machine. Portions of virtual memory associated with the memory 108 may be allocated to particular virtual machines. This segregation provides benefits including fault tolerance, security, and memory management.

The application 122 may execute in a foreground state 202 or a background state 204. While in the foreground state 202, the application is configured to accept input and generate output. The input may be received from the user 104 while the output may be provided to the user 104. For example, where the application 122(1) provides functionality for sending and receiving emails, the input may be the user 104 typing characters on a keyboard while the output is displaying on the display 110 what has been typed. In comparison, the application 122 in the background state 204 may be unresponsive. The background state 204 may be configured to consume fewer resources than the foreground state 202. These resources may comprise one or more of processor time, memory, power, and so forth. In some implementations the application 122 may transition between a first state and a second state, rather than between the foreground state 202 and the background state 204. For example, the application 122 may transition from a first state consuming electrical power to a second state consuming less electrical power than the first state.

The rendering engine module 120 may transition one or more of the applications 122 between the foreground state 202 and the background state 204. This transition may be initiated by an input from the user 104, one of the applications 122, the operating system module 116, the notification module 124, the other modules 126, and so forth.

In some implementations, a single application 122 may be executed in the foreground state 202 while other applications are executed in the background state 204. For example, on a resource constrained user device 102 with limited memory, a single application 122 may be in the foreground state 202 at a given time.

The rendering engine module 120 may also comprise a compression module 206. The compression module 206 may be configured to compress one or more portions of data associated with a particular application 122 which is in the background state 204. The compression module 206 may be configured to use one or more compression algorithms. In one implementation the compression module 206 may implement the zlib software library as developed by Jean-loup Gailly and Mark Adler and available at zlib.net. The compression provided by the compression module 206 may be asymmetrical in that time taken to compress data may be significantly greater than time taken to decompress data. During compression of data associated with the application 122 which is in, or transitioning to, the background state 204 this asymmetry may be unnoticed by the user 104. For example, the compression takes place during the transition of the application 122 to the background while another application in the foreground state 202 occupies the user's 104 attention. Compression may be used to free up additional memory for use by other applications or operating system functions, to improve security through obfuscating memory contents, to reduce power consumption by reducing a number of physical memory elements used to store data, and so forth. Discussion of the compression of at least a portion of the data associated with the application 122 is discussed below in more detail with regard to FIGS. 9-14.

Figure 3:
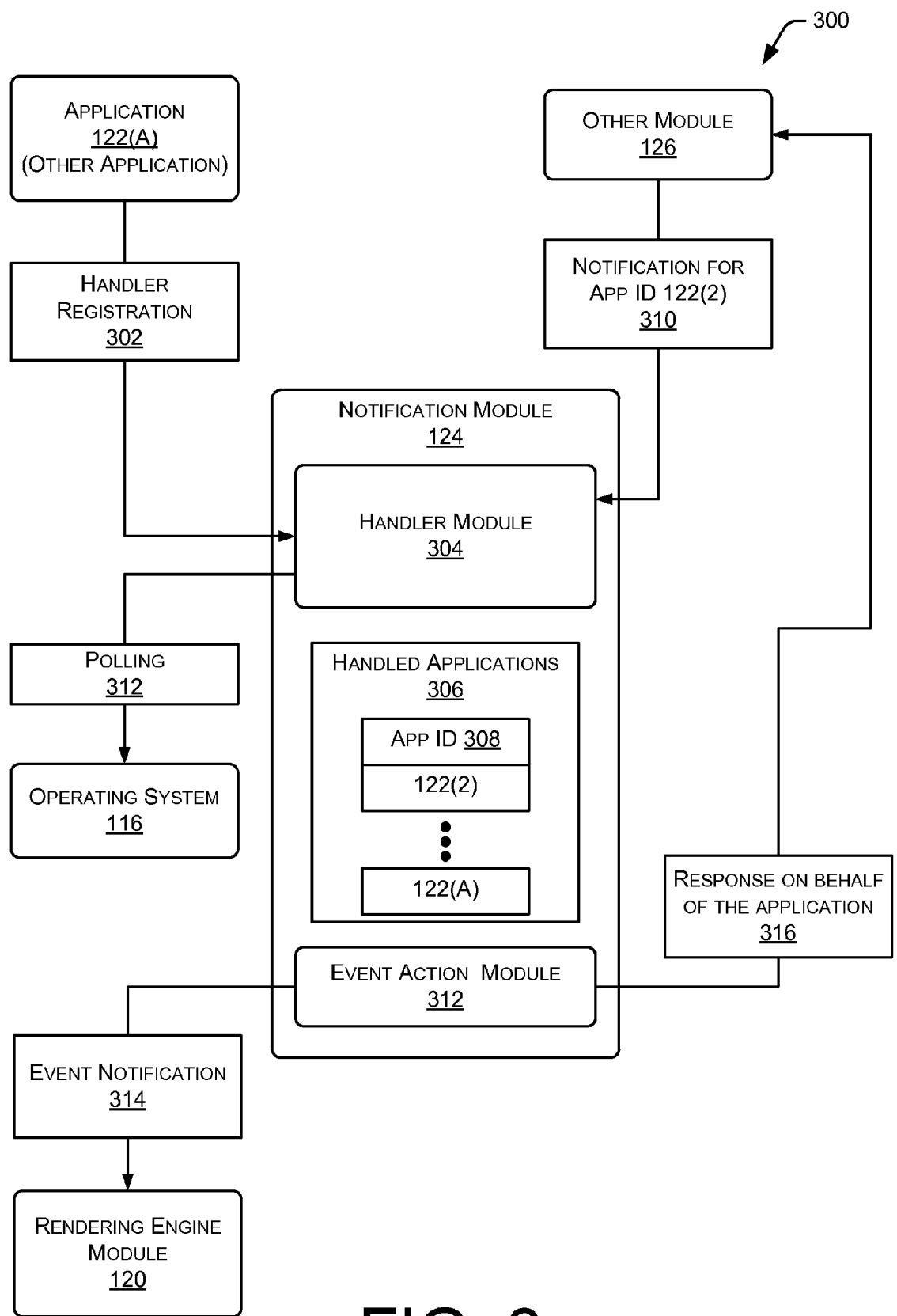
FIG. 3 illustrates a block diagram of a notification module configured to deliver notifications to an application in a background state.

FIG. 3 illustrates a block diagram 300 of the notification module 124. As described above, the notification module 124 is configured to receive notifications for the application 122 which is in the background state 204.

The notification module 124 is configured to receive a handler registration 302 from the application 122. In some implementations the handler registration 302 may be sent by the rendering engine module 120, the operating system module 116, or another module. The handler registration comprises data indicating that the particular application 122 will be registered for handling by the notification module 124. Once registered, the notification module 124 will act on and may respond to notifications intended for the registered application.

Which applications 122 may be registered when placed into the background state 204 may vary. In some implementations all applications 122 which are transitioned to the background state 204 may be registered using the handler registration 302. In other implementations, selected applications 122 may be registered. This selection may be manual or automatic. For example, applications 122 which are configured to receive data from the network 128 may be automatically registered.

The notification module 124 may comprise a handler module 304. The handler module 304 is configured to process the handler registration 302 and add or remove applications 122 to handled application data 306. The handled application data 306 may comprise a list, array, tree, or other data structure configured to store information about what applications 122 have called for handling of notifications by the notification module 124. These applications 122 may be those which are in the background state 204, and would otherwise be unable to respond to notifications while in that state.

The handled application data 306 may include an application identification 308, or "app ID" which designates the particular application 122 for which the handler module 304 will process and respond to. In some implementations the application identification 308 may comprise a process identifier.

The operating system module 116, the other module 126, and so forth may generate a notification 310 directed to the application 122. For example, as shown here, the other module 126 has generated a notification for application 122(2). This notification may comprise data, such as that a location for a scheduled meeting has changed.

The handler module 304 processes the notification 310 to determine if the application 122 for which the notification is designated is one of the handled application data 306. In this example, notifications for the application 122(2) are being handled. Based at least in part on the application identification 308 in the notification 310, an event action module 312 generates an event notification 314.

The event notification 314 may comprise an event identifier configured to designate a type of notification received. The event identifier may indicate one or more of the following conditions: input from a user, input from another application, input received via one of the network interfaces 114, an operating system event, and so forth. Continuing the example above, the event notification 314 generated in response to the notification 310 to the application 122(2) of the change in meeting location may include event identifier information indicating that the information was received from the server 130. The rendering engine module 120 may receive the event notification 314, and based at least in part on the information therein, may initiate a transition of the application 122(2) from the background state 204 to the foreground state 202 such that the application 122(2) is available to process the event notification 314 and provide to the user 104 and indication that the meeting location has changed.

As described above, when the rendering engine module 120 uses the compression module 206 to compress at least a portion of the applications 122 which are in the background state 204, the transition of the application 122 from the background state 204 to the foreground state 202 may comprise decompression.

In some implementations the event action module 312 of the notification module 124 may be configured to generate and provide a response for the application 316 which is registered for handling. As part of the handler registration 302, particular responses to particular notifications 310 may be configured. For example, the notification module 124 may be configured to respond to a "keep alive" or "heartbeat" signal from the server 130 designated for the application 122(2). Notifications associated with this "keep alive" may then be responded to in a pre-determined fashion, without generating an event notification 314 and transitioning the application 122 from background state 204 to the foreground state 202. This prevents an unnecessary transition from the background state 204 to the foreground state 202. To the server 130 or the other module 126 attempting to communicate with the application 122 in the background state 204, the application 122 appears to be active and responsive when dormant in the background state 204. In some implementations, at least a portion of the data comprising the application 122 in the background state 204 may be compressed.

Illustrative Process of Handling Notifications

Figure 4:
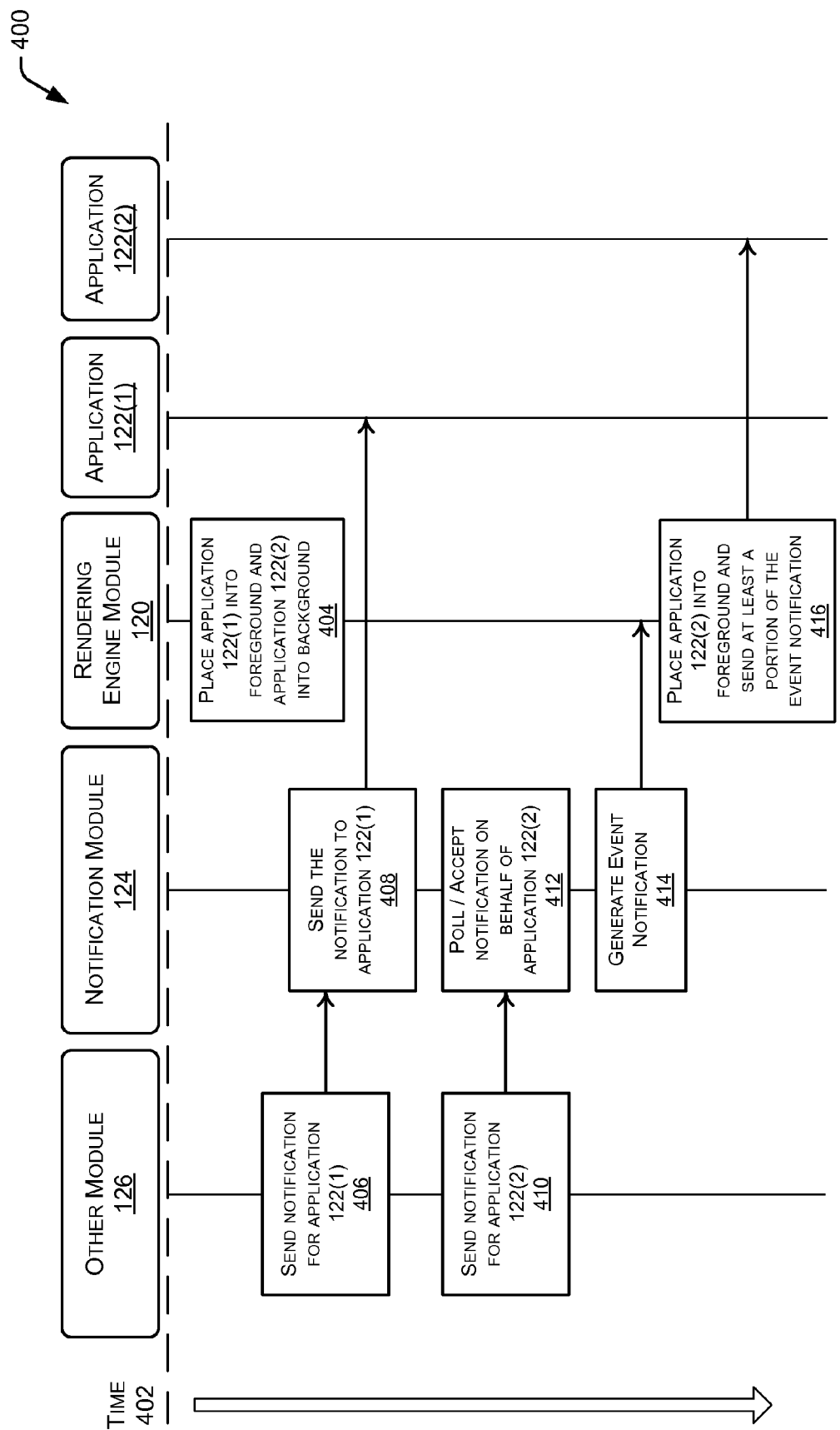
FIG. 4 illustrates interactions between several modules to send notifications to an application in a background state.

FIG. 4 illustrates interactions 400 between several modules to provide notifications to the application 122 in the background state 204. In this diagram, time increases along the direction of arrow 402. Illustrated are the rendering engine module 120, the applications 122(1) and 122(2), the notification module 124, and the other module 126.

At 404, the rendering engine module 120 places the application 122(1) into the foreground state 202 and application 122(2) is placed into the background state 204. When in the background state 204, at least a portion of the data associated with the application 122 in the background state 204 may be compressed to free up memory resources. This is discussed in more detail below with regard to FIGS. 9-14.

At 406, the other module 126 sends a notification intended for the application 122(1). Because the application 122(1) is in the foreground state 202, at 408 the notification module 124 sends the notification to the application 122(1).

In comparison, at 410 the other module 126 sends a notification for the application 122(2). At 412, the notification module 124 accepts the notification for the application 122(2). In some implementations the notification module 124 may poll other modules for notifications. At 414, based at least in part on the notification, the notification module 124 generates the event notification 314.

In some implementations, delivery of the event notification 314 may be delayed or omitted. A delay may be introduced for a pre-determined amount of time or until some other event occurs. For example, the event notification 314 may be held for delivery until the application 122 transitions to the foreground state 202 or to prevent the application 122 from oscillating between the foreground state 202 and the background state 204.

Delivery of the event notification 314 may be omitted when the notification module 124 is configured to respond for the application 122. For example, as described above with regard to FIG. 3, the event action module 312 may be configured to generate and provide a response for the application 122 in the background state.

The event notification 314 is sent to the rendering engine module 120. The event notification 314 may be sent via an interprocess communication, entering data into the HTML5 input queue, and so forth.

At 416, based at least in part on the event notification 314, the rendering engine module 120 places the application 122(2) into the foreground state 202 and sends at least a portion of the event notification 314 to the application 122(2). The application 122(2) in the foreground state 202, may thus process the event notification 314.

Figure 5:
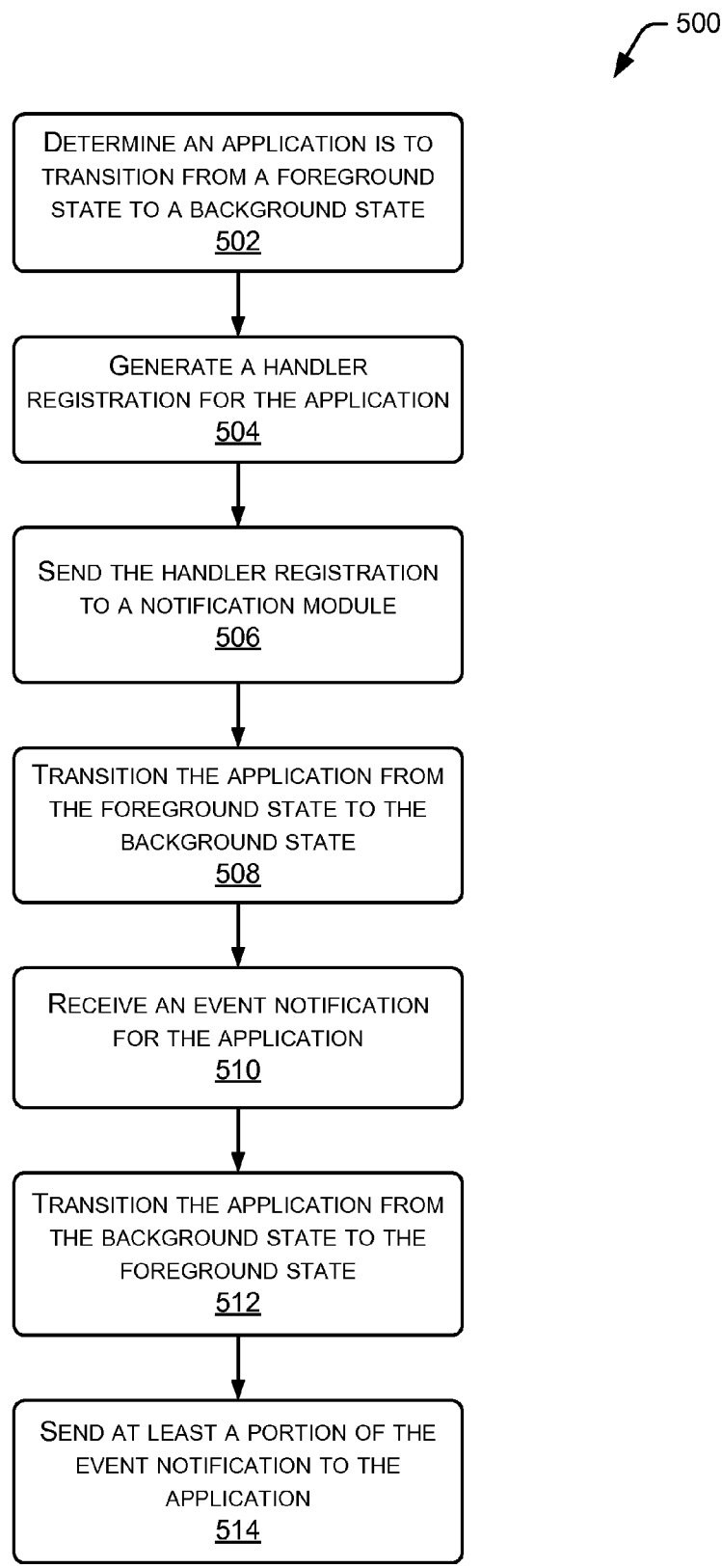
FIG. 5 is a flow diagram of a process of transitioning an application between the foreground state and the background state.

FIG. 5 illustrates a flow diagram of a process 500 of transitioning an application between the foreground state 202 and the background state 204. This process may be implemented at least in part by the rendering engine module 120. As described above, in some implementations the foreground state 202 may be configured to accept input from the user 104 and generate output to the user 104. The background state 204 may be configured to consume fewer resources than the foreground state 202. These resources may comprise processor time, memory, power, and so forth.

Block 502 determines the application 122 executing in the rendering engine module 120 is to transition from the foreground state 202 to the background state 204. For example, the rendering engine module 120 may receive a user input which calls for the user 104 to interact with the application 122(2) which is in the background state 204, thus triggering a transition which places the application 122(1) into the background.

Block 504 generates a handler registration for the application 122. Block 506 sends the handler registration to the notification module 124. As described above, in some implementations the rendering engine module 120 may be configured to process HTML version 5 files or greater, and the application comprises an HTML version 5 or greater file. In this implementation, the handler registration may comprise a JavaScript handler. For example, the JavaScript handler may be included within an HTML tag such as "onload" or "onunload."

Block 508 transitions the application 122 from the foreground state 202 to the background state 204. In some implementations, the transition to the background state 204 may include compressing at least a portion of the data associated with the application 122. This is discussed in more detail below with regard to FIGS. 9-14. The application 122 may complete transition to the background state 204 and remain in that state.

Block 510 receives an event notification 314 for the application 122. For example, as described above the notification module 124 may provide the event notification 314 to the rendering engine module 120.

Block 512, based at least in part on the event notification 314, transitions the application 122 from the background state 204 to the foreground state 202. Once transitioned, block 514 sends at least a portion of the event notification 314 to the application 122 which is now in the foreground state 202.

Figure 6:
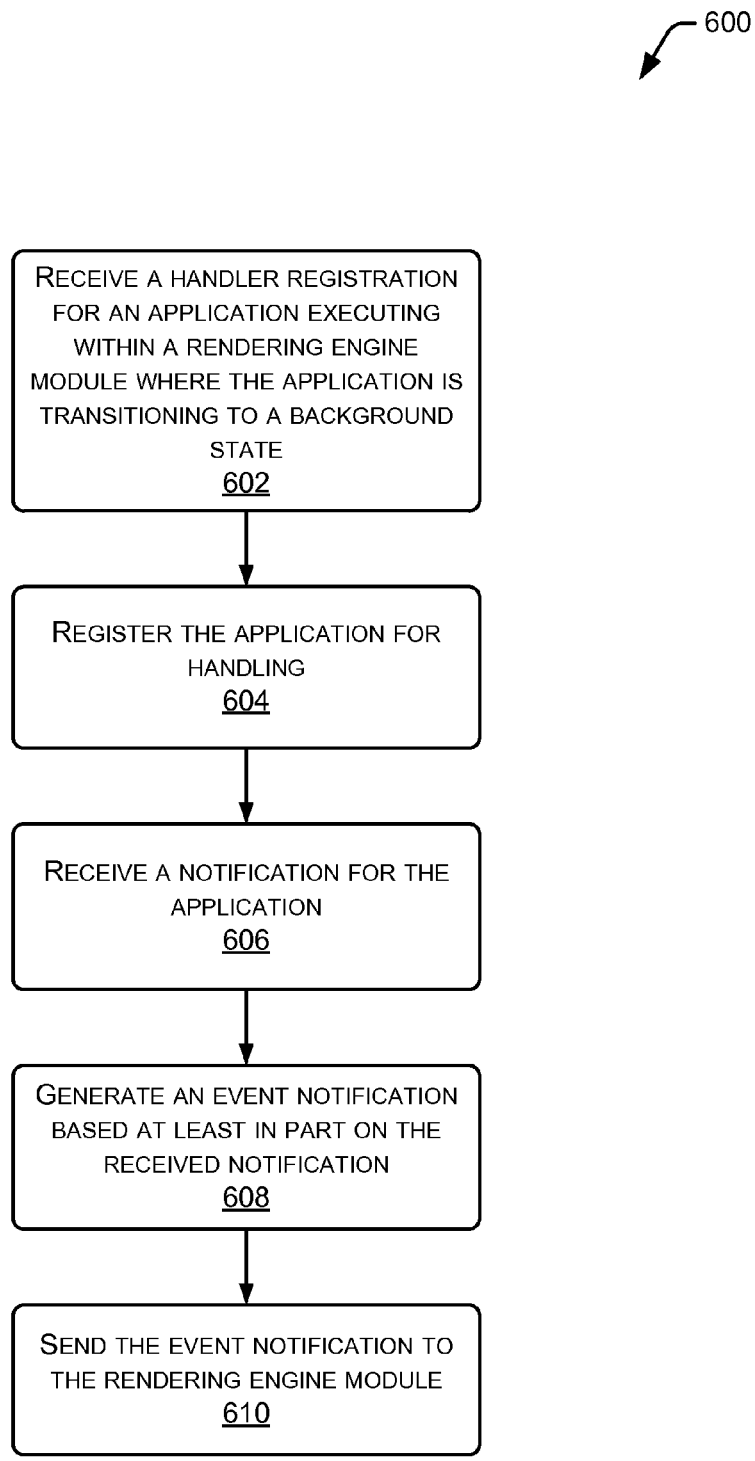
FIG. 6 is a flow diagram of a process of sending at least a portion of an event notification to an application in the background state.

FIG. 6 illustrates a flow diagram 600 of a process of sending at least a portion of the event notification to an application in the background state. This process may be implemented at least in part by the notification module 124.

Block 602 receives the handler registration 302 for an application 122 executing within the rendering engine module 120 where the application 122 is transitioning to the background state 204. Block 604 registers the application 122 for handling. As described above with regard to FIG. 3, the handler module 304 may add the application identification 308 associated with the application 122 to the handled applications data 306.

Block 606 receives a notification 310 which is designated for the application 122. As described above, the notification 310 may result from events such as when data is received for the application, a timer event for the application fires, receipt of an incoming message for the application, and so forth.

Block 608 generates an event notification 314 based at least in part on the received notification 310. The event notification 314 may comprise an event identifier configured to designate a type of notification received. The event identifier may indicate one or more of the following conditions: input from a user, input from another application, input received via one of the network interfaces 114, an operating system event, and so forth.

Block 610 sends the event notification 314 to the rendering engine module 120. In some implementations the event notification 314 may be sent to the application 122.

Using these techniques, a developer of the application 122 is freed from designing the application 122 to be responsive while in the background state 204. Instead, the developer may design the application 122 and the functionality of sending notifications to the application 122 in the background state 204 may operate without specific implementation such as using particular calls.

Figure 7:
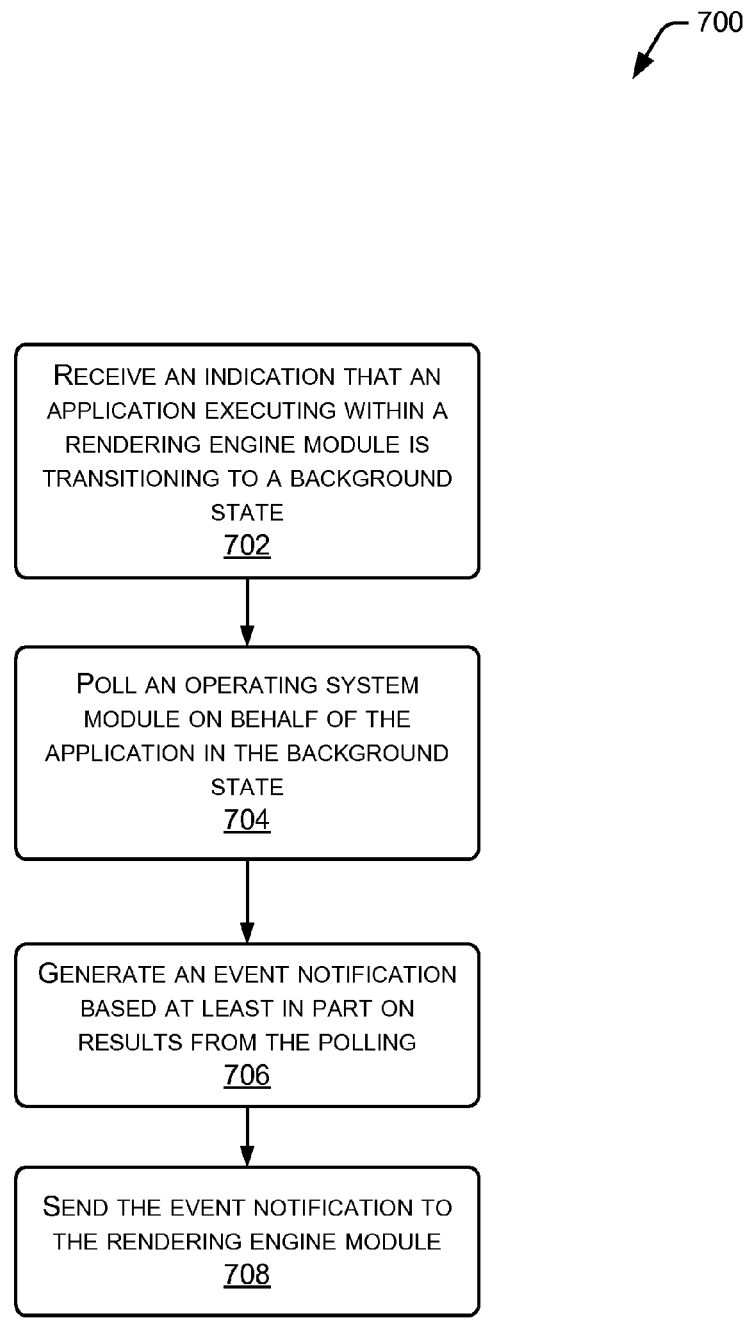
FIG. 7 is a flow diagram of a process of generating event notifications for an application in the background state.

FIG. 7 illustrates a flow diagram 700 of a process of generating event notifications for an application in the background state 204. This process may be implemented at least in part by the notification module 124.

Block 702 receives an indication that an application 122 executing within the rendering engine module 120 is transitioning to the background state 204. Block 704 polls an operating system module 116, or other module 126 for the application 122 which is in the background state 204.

Block 706 generates an event notification 314 based at least in part on results from the polling. For example, the polling may result in an indication that the networking interfaces 114 have received data for the application 122(2) which is in the background state 204. The event notification 314 may indicate that data has been received for the application 122(2).

Block 708 sends the event notification 314 to the rendering engine module 120. The rendering engine module 120 may then bring the application 122 associated with the event notification 314 into the foreground state 202 for processing information associated with the event notification 314.

Figure 8:
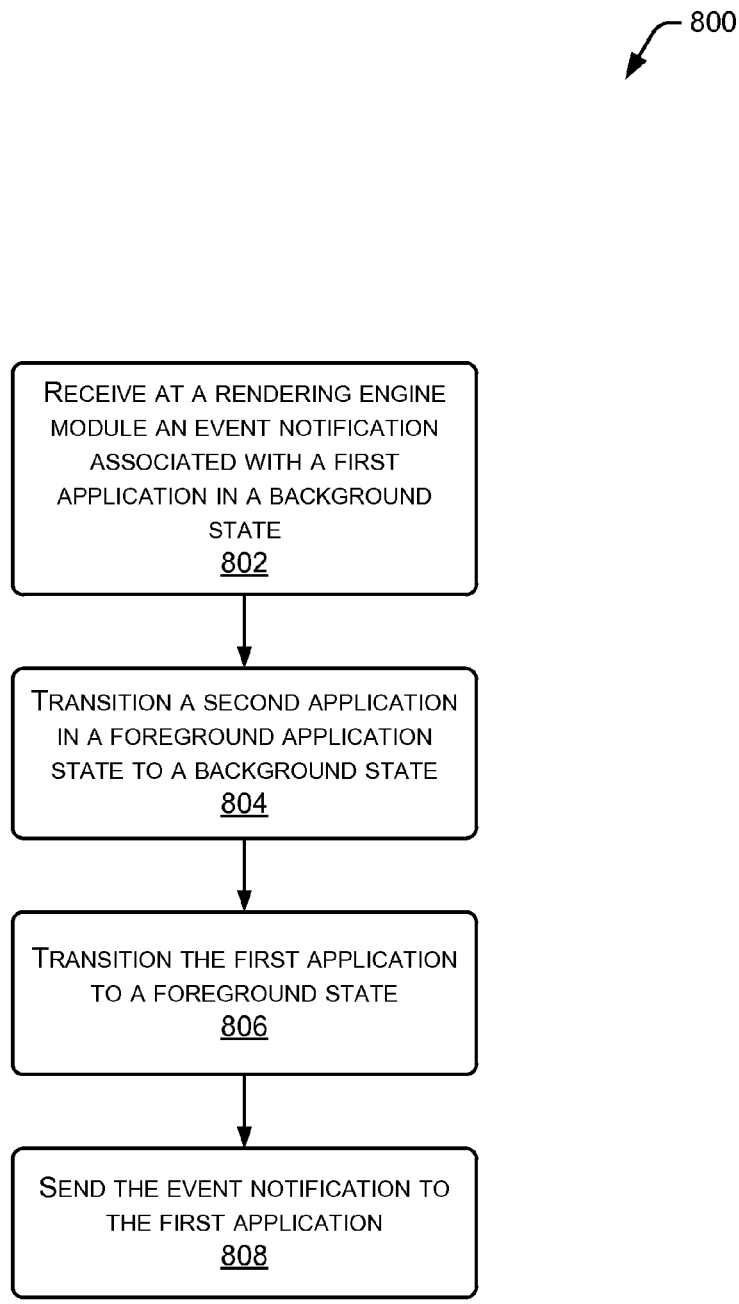
FIG. 8 is a flow diagram of a process of transitioning an application to a foreground state.

FIG. 8 illustrates a flow diagram 800 of a process of transitioning the application 122 to the foreground state 202. This process may be implemented at least in part by the rendering engine module 120.

Block 802 receives, such as at the rendering engine module 120, the event notification 314 associated with a first application 122 in the background state 204. For example, the application 122(2) may be in the background state 204.

In some implementations, such as where a single application 122 may be in the foreground state 202 at one time, block 804 transitions a second application 122 in the foreground state 202 to a background state 204. As described above, this transition may include compressing at least a portion of the data associated with the second application 122. Continuing the example, the application 122(1) may be placed into the background state 204.

Block 806 transitions the first application 122 to the foreground state 202. For example, the application 122(2) may be placed into the foreground state 202. This transition may include decompressing the first application 122 and restoring to the memory 108 the uncompressed data for operation. Once the first application 122 is in the foreground state 202 and thus able to process data, block 808 sends the event notification 314 or a portion thereof to the first application 122. In this example, the event notification 314 may be sent to the application 122(2) for processing.

Illustrative Process of Compressing and Decompressing Data

Figure 9:
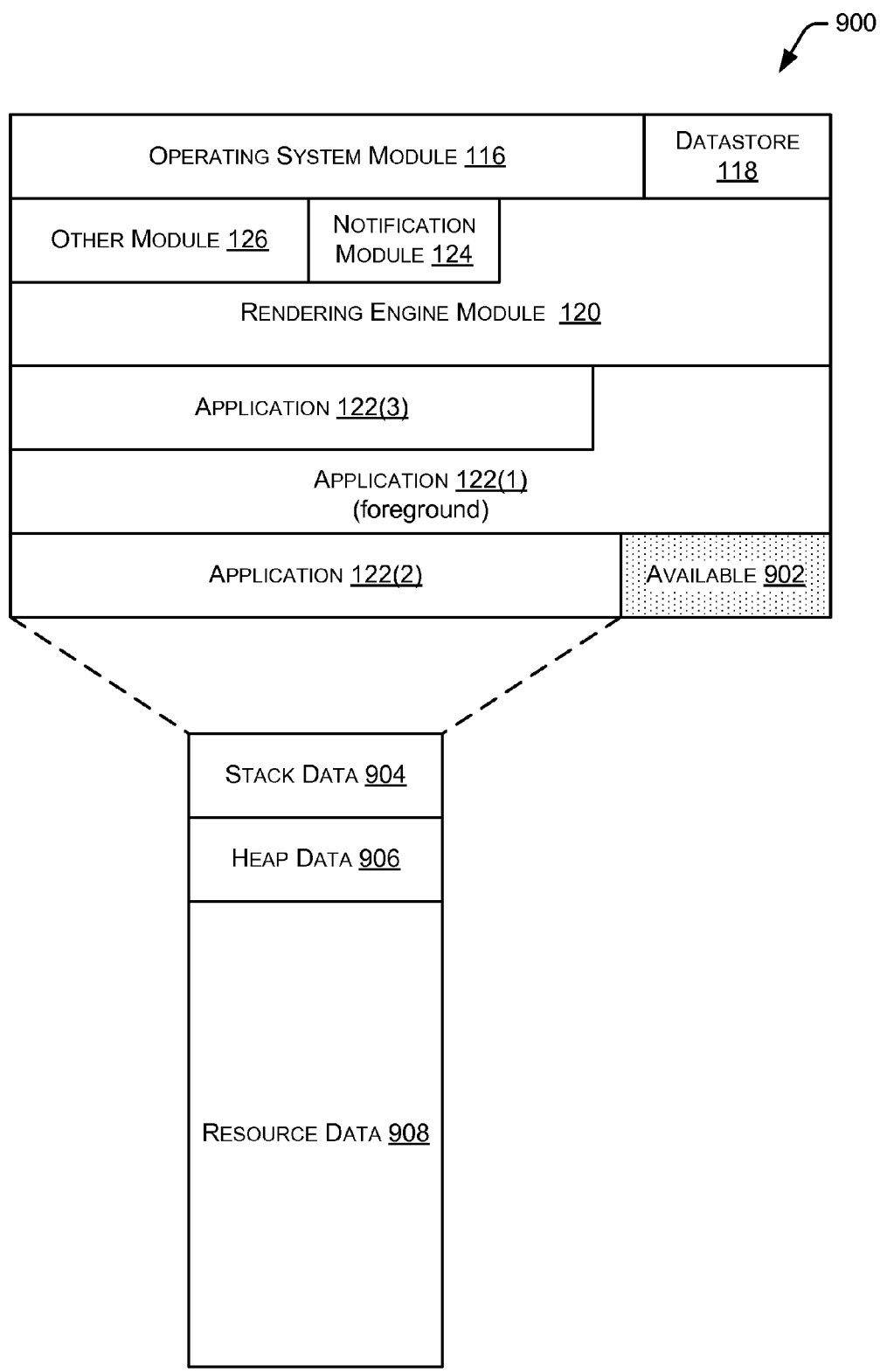
FIG. 9 illustrates a schematic of a memory map associated with the device of FIG. 1 without compression.

FIG. 9 illustrates a schematic 900 of a memory map associated with the user device 102 of FIG. 1 without compression. As described above, some devices may be resource constrained in that they may have a fixed amount of memory 108 available for use. As shown here, in resource constrained devices, execution of additional applications 122 may result in depletion of memory resources, and ultimately result in applications 122 being killed, undesirable behavior, and so forth.

An overall memory map of the memory 108 is depicted. In some implementations, this memory map may be of virtual memory allocation. The relative sizes between the different pieces of data shown here in the memory 108 are provided by way of illustration, and not as a limitation. The memory 108 consumed by the data comprising the operating system module 116, the datastore 118, the rendering engine module 120, the applications 122(1)-(3), the notification module 124, and one of the other modules 126 are depicted. The application 122(1) is in the foreground state 202 while the other applications 122(2)-(3) may be in the background state 204. Also depicted is unallocated available memory space 902. The available memory space 902 represents locations in the memory 108 which are available for storing data. As depicted here, only a small amount of available memory space 902 is present, which may adversely impact the operation of additional applications 122, modules, and so forth.

As described above, the application 122(2) may be in the background state 204. Associated with the application 122(2) is stack data 904, heap data 906, and resource data 908. The stack data 904 comprises a stack associated with the application 122(2). The heap data 904 comprises a heap associated with the application 122(2). The resource data 908 may comprise other information such as executable code, data associated with the application 122(2) such as bitmaps, audio files, text, and so forth.

Figure 10:
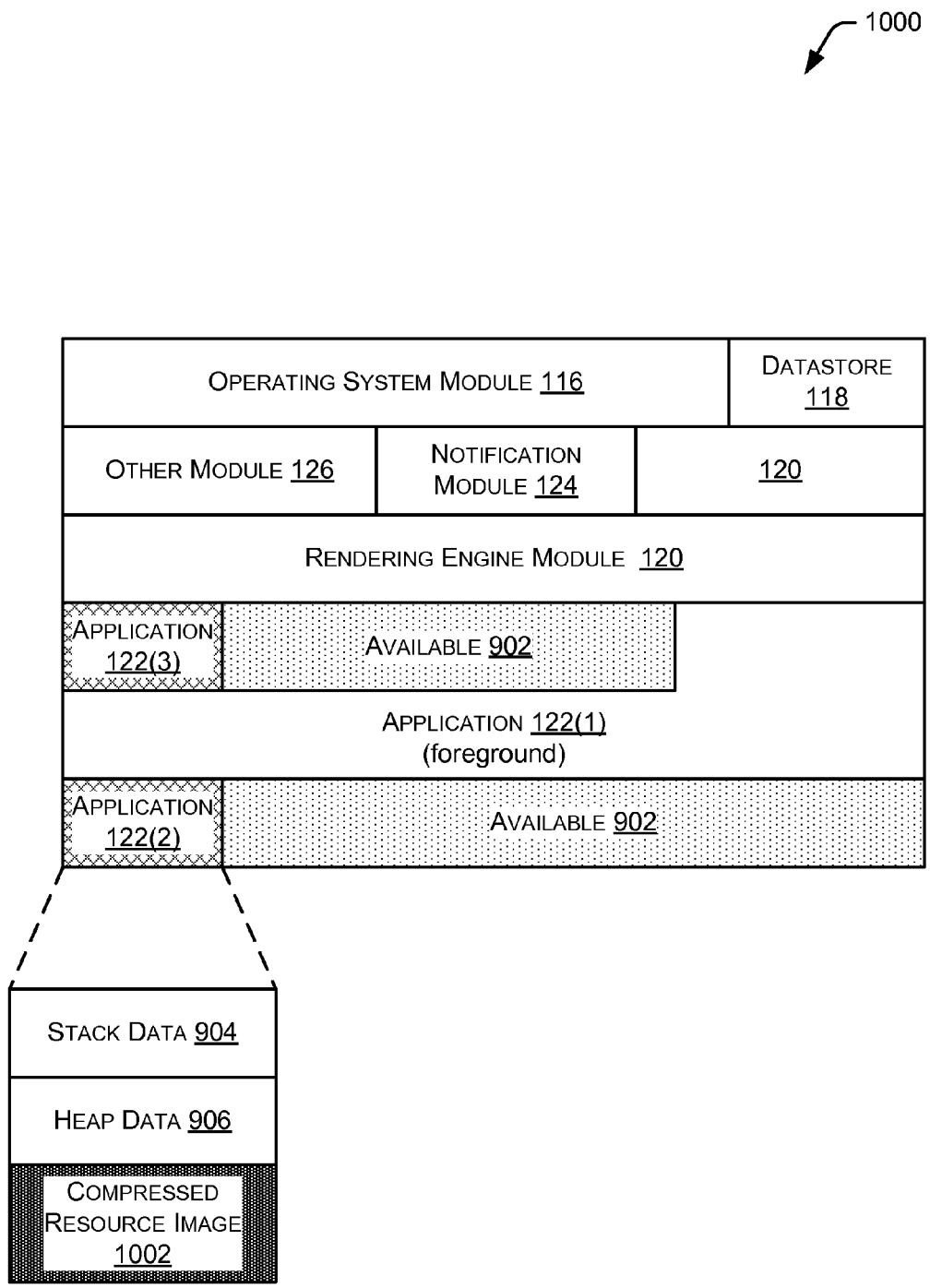
FIG. 10 illustrates a schematic of the memory map of FIG. 9 with compression applied to the applications in the background state.

FIG. 10 illustrates a schematic 1000 of the memory map of FIG. 9 with compression applied to the applications 122 in the background state 204. In this illustration, significantly greater available space 902 is shown, providing increased memory resources for use by other applications. This increase in space is due to the compression applied by the compression module 206 to one or more portions of data of the applications 122(2) and 122(3) which are in the background state 204. As shown here, portions of the data associated with the application 122(2) have been compressed. The stack data 904 and the heap data 906 have been left uncompressed, while the resource data 908 has been compressed into a compressed resource image 1002. Relative to the uncompressed resource data 908, the compressed resource image 1002 is significantly smaller. As a result, additional available memory 902 may be used. In one experiment, the data in the memory 108 for an application 122 was compressed from about 22.5 megabytes (MB) while in the foreground state 202 to about 2.4 MB in the background state 204. The degree of compression may vary based at least in part on the compression algorithm implemented, available processing resources, type of data to compress, and so forth.

The application 122(1) in the foreground state 202 remains uncompressed and in an operational condition. And application 122 is deemed to be in an operational condition when able to receive input, process data, and generate output. The operating system module 116, the rendering image module 120, the notification module 124, and the application 122(1) remain unaffected by the operation. Furthermore, the applications 122(2)-(3) which are compressed may be unaware of the compression. The applications 122 may be configured to call for or manage the compression process, or may be transparent to the compression process. In some implementations, as described above, the notification module 124 may respond for the compressed applications 122 in the background state 204, accepting notifications on their behalf.

In this illustration the compressed resource image 1002 excludes or omits the stack data 904 and the heap data 906. In some implementations the stack data 904 and the heap data 906 may be omitted from compression to enhance system stability. In other implementations the compressed resource image 1002 may include the stack data 904, the heap data 906, or both.

Figure 11:
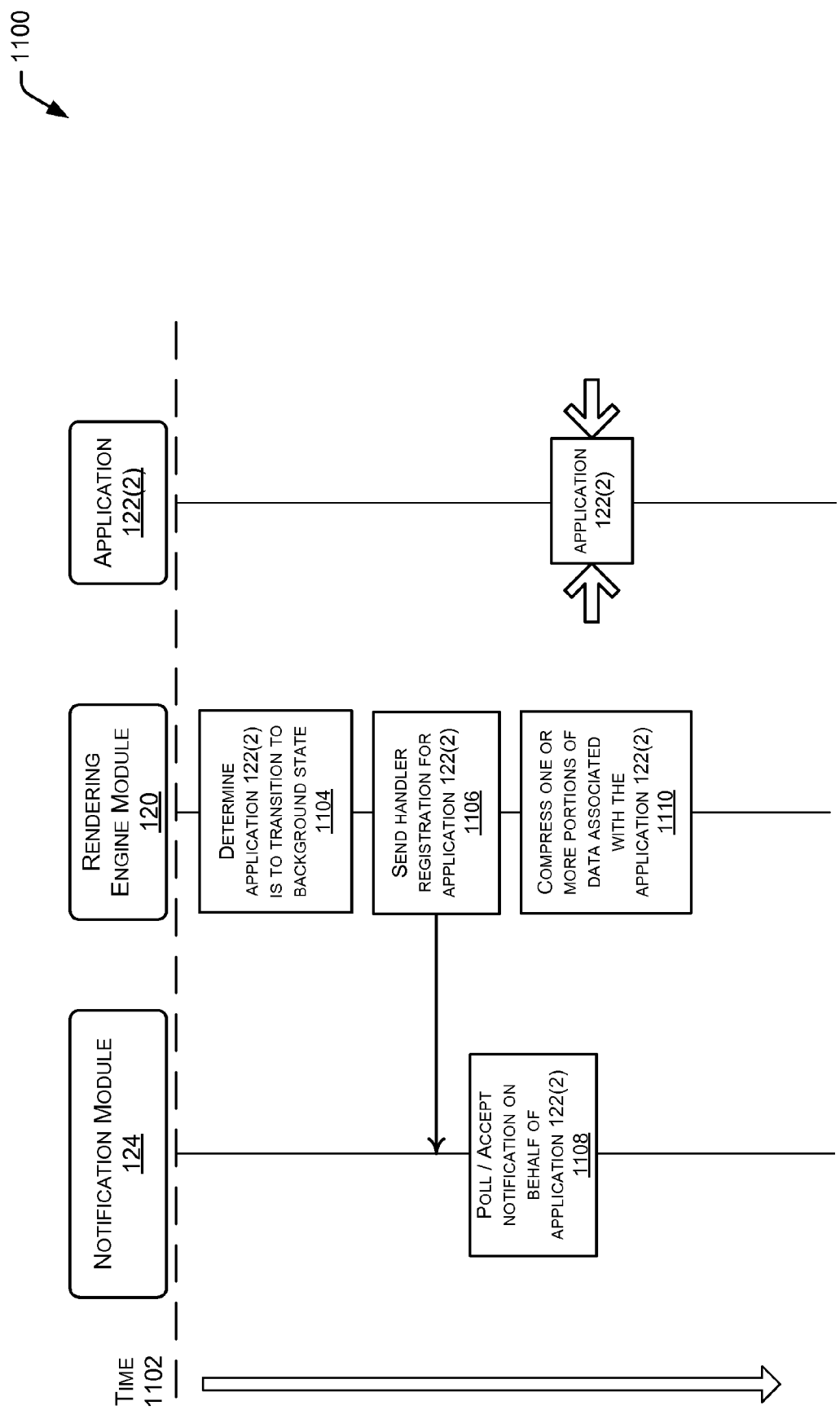
FIG. 11 illustrates interactions between several modules to reduce memory consumption by compressing the application in the background state.

FIG. 11 illustrates interactions 1100 between several modules to reduce memory consumption by compressing at least a portion of the data associated with the application 122 in the background state 204. In this diagram, time increases along the direction of arrow 1102. Illustrated are the notification module 124, the rendering engine module 120, and the application 122(2).

At 1104, the rendering engine module 120 transitions the application 122(2) from the foreground state 202 to the background state 204. For example, the user 104 may have selected to bring the application 122(1) into the foreground state 202 and place the application 122(2) into the background state 204.

At 1106, the rendering engine module 120 sends the handler registration 302 for the application 122(2) to the notification module 124. At 1108, the notification module 124, based at least in part on receiving the handler registration 302, accepts notification for the application 122(2). In some implementations, the notification module 124 may poll other applications for the application 122(2). With the notification module 124 handling notifications, at 1110 the rendering engine module 120 compresses one or more portions of data associated with the application 122(2) to form the compressed resource image 1002. The application 122(2) which is in the background state 204 now uses less of the memory 108, freeing the memory for use by other applications 122, modules, and so forth.

Figure 12:
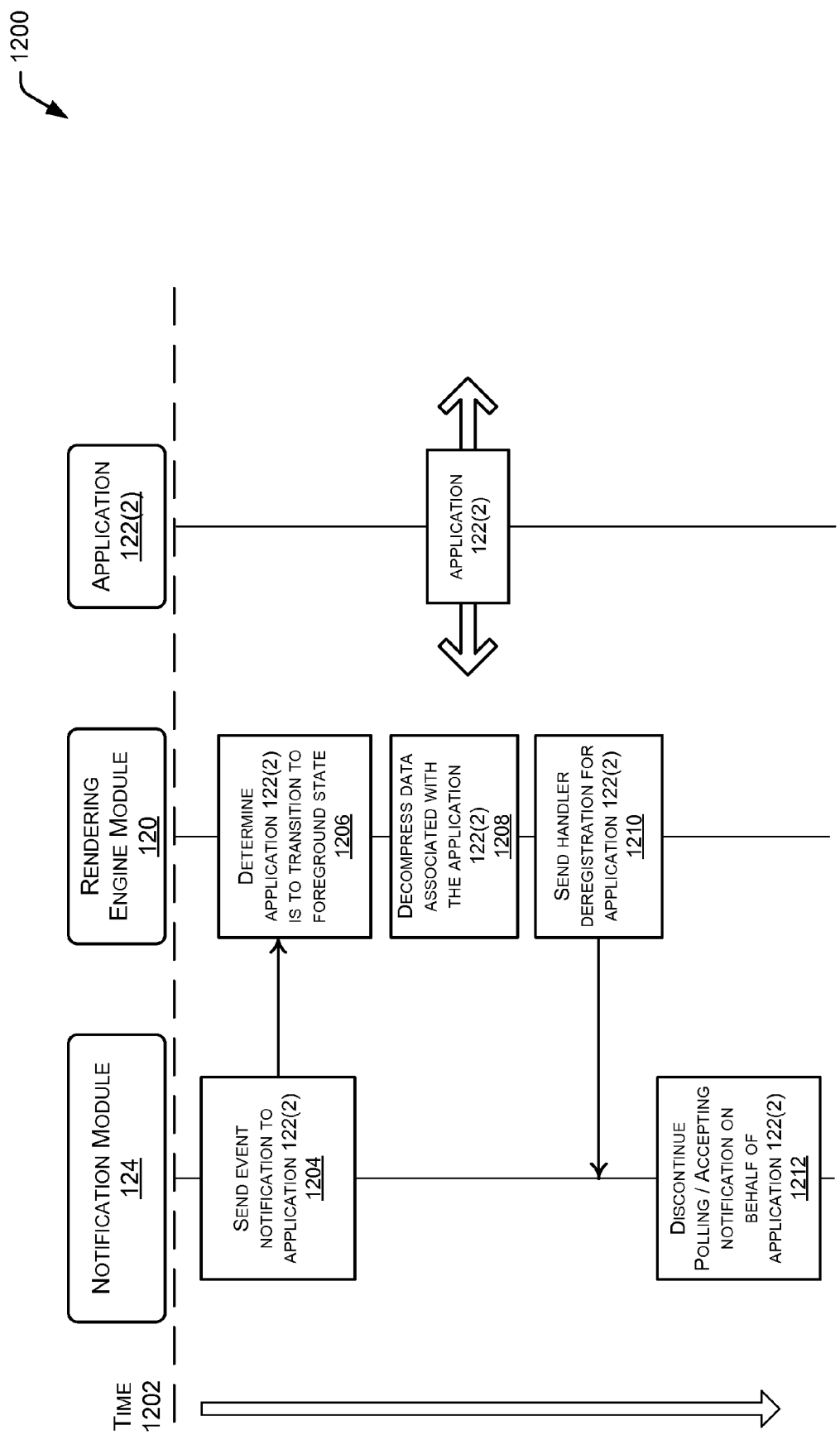
FIG. 12 illustrates interactions between several modules to restore a compressed application to the foreground state.

FIG. 12 illustrates interactions 1200 between several modules to restore the compressed application 122 to the foreground state 202. As above, time increases along the direction of arrow 1202.

Continuing the above example where the application 122(2) is in the background state 204, at 1204 the notification module 124 may send the event notification 314 to the rendering engine module 120. The rendering engine module 120 at 1206 determines the application 122(2) is to transition to the foreground state 202. For example, the event notification 314 may indicate that data has been received from the server 130 for processing by the application 122(2).

At 1208, the rendering engine module 120 decompresses the data associated with the application 122 in the background state 204. For example, the compression module 206 may decompress the compressed resource image 1002 of the application 122(2). The rendering engine module 120 may then restore the resource data 908 to previously stored virtual memory addresses, placing the application 122(2) back into an executable condition.

At 1210, the rendering engine module 120 sends a handler deregistration for the application 122(2) to the notification module 124. At 1212, the notification module 124 discontinues polling or accepting notifications for the application 122(2). The application 122(2) is now in the foreground state 202 and operational to respond to notifications without the notification module 124.

Figure 13:
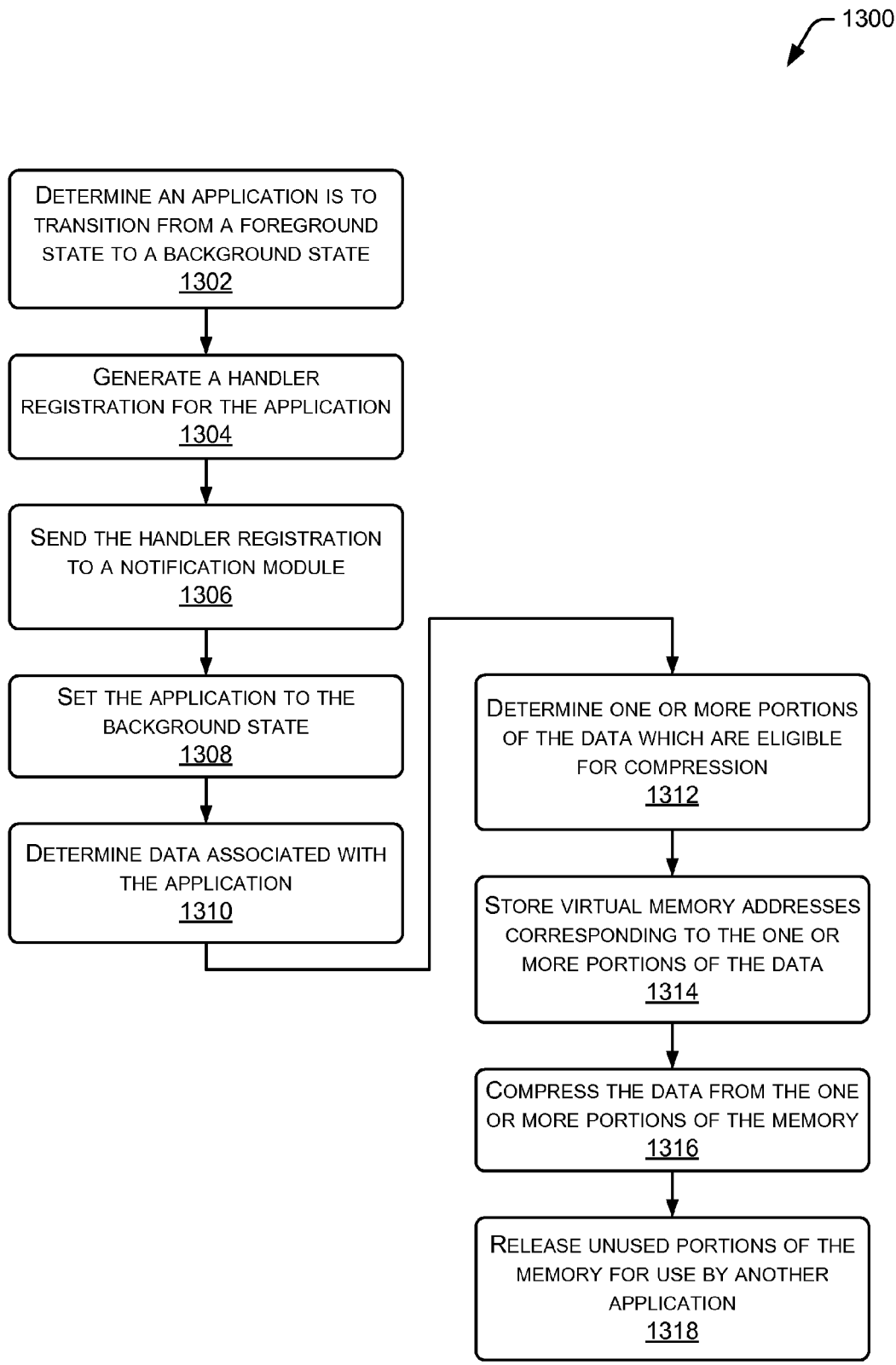
FIG. 13 is a flow diagram of a process of reducing memory consumption by compressing data associated with an application in a background state.

FIG. 13 illustrates a flow diagram 1300 of a process of reducing memory consumption by compressing data associated with an application in a background state 204. This process may be implemented at least in part by the rendering engine module 120. In some implementations the rendering engine module 120 is configured to process HTML version 5 or greater and the application 122 may comprise an HTML version 5 or greater file.

Block 1302 determines the application 122 executing in the rendering engine module 120 is to transition from the foreground state 202 to the background state 204. For example, input from the user 104 may result in the application 122(2) being brought into the foreground state 202 for the user 104 to interact with which may call for the application 122(1) to be placed into the background state 204 to conserve system resources such as memory.

Block 1304 may generate the handler registration 302 for the application 122. Block 1306 sends the handler registration 302 to the notification module 124. For example, the application 122(1) may be registered such that the notification module 124 will respond to notifications for the application 122(1).

Block 1308 sets the application 122 to the background state 204. For example, the application 122(1) may be designated as being in the background state 204 by the rendering engine module 120 such that any processing calling for the application 122(1) will require restoring the application 122(1) to the foreground state 202.

Block 1310 determines data associated with the application. This determination may comprise retrieval of a memory map configured to identify segments of memory allocated to a particular application executing on the rendering engine module 120 in a virtual machine. For example, on some operating systems such as those based on the Linux™ kernel, the "showmap" or "pmap" functions or utilities may be used.

Block 1312 determines one or more portions of the data which are eligible for compression. Eligibility for compression may be determined from one or more compression criteria. In some implementations, the data is eligible for compression when meeting the one or more compression criteria such as being one or more of anonymous, unshared with another application, or above a pre-determined size threshold. As depicted in FIG. 10, in some implementations the data eligible for compression excludes the stack data 904, the heap data 906, or both which are associated with the application 122.

Block 1314 stores virtual memory addresses corresponding to the one or more portions of the data. During decompression, these virtual memory addresses may be used to restore the application 122(1) to operational condition.

Block 1316 compresses the one or more portions of the data. As described above, in some implementations the compression module 206 may utilize or implement the zlib compression library which embodies the DEFLATE algorithm.

Block 1318 releases unused portions of the memory for use by another application. For example, the portions of the available memory 902 which have been freed as a result of the compression may be released for use.

Figure 14:
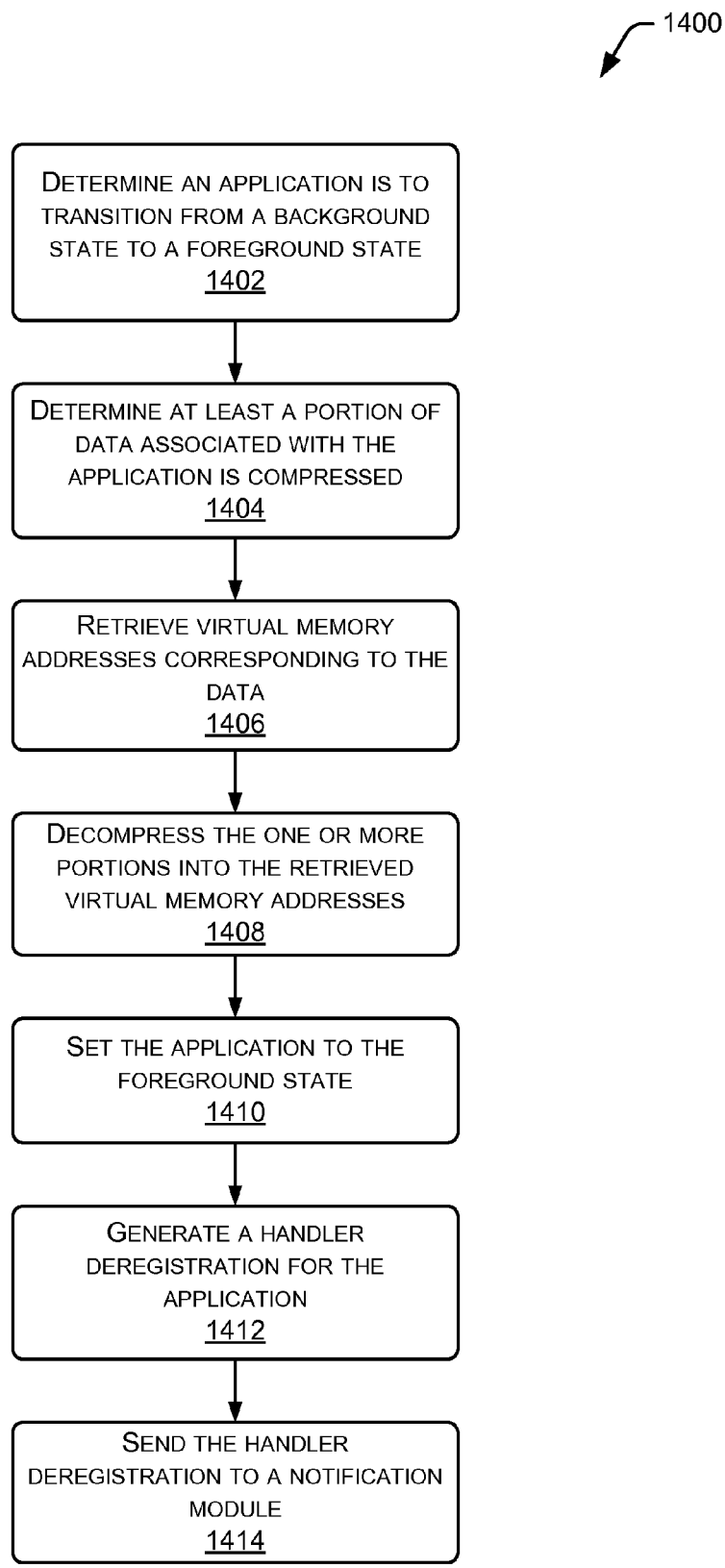
FIG. 14 illustrates a flow diagram of a process of transitioning the application with compressed data to the foreground state.

FIG. 14 illustrates a flow diagram 1400 of a process of transitioning the application 122 with compressed data to the foreground state 202.

Block 1402 determines the application 122 executing in the rendering engine module 120 is to transition from the background state 204 to the foreground state 202. For example, input from the user 104 may result in the application 122(1) being brought into the foreground state 202 for the user 104 to interact with which may call for the application 122(2) to be placed into the background state 204 to conserve system resources such as memory.

Block 1404 determines at least a portion of data associated with the application 122 is compressed. In some implementations this determination may comprise inspecting a flag or bit indicating presence of compressed data.

Block 1406 retrieves the virtual memory addresses corresponding to the data. As described above with regard to FIG. 13, the virtual memory address pre-compression may be stored to allow for the restoration of the application 122 to operational condition.

Block 1408 decompresses the data into the retrieved virtual memory addresses. As described above, the compression module 206 may perform this function as implemented by the zlib library.

Block 1410 sets the application 122 to the foreground state 202. This indicates the application 122 is in operational condition and will respond to notifications without the need for intervention by the notification module 124.

Block 1412 generates a handler deregistration for the application 122. As described above, this handler deregistration informs the notification module 124 to cease acting for the application 122 now in the foreground state 202.

Block 1414 sends the handler deregistration to the notification module 124. Once processed by the notification module 124, subsequent notifications 310 for the application 122 now in the foreground state 202 will be passed to the application 122.

CONCLUSION

The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

Certain aspects of the disclosure are described above with reference to block and flow diagrams of systems, methods, apparatuses, and/or computer program products according to various implementations. It will be understood that one or more blocks of the block diagrams and flow diagrams, and combinations of blocks in the block diagrams and the flow diagrams, respectively, can be implemented by computer-executable program instructions. Likewise, some blocks of the block diagrams and flow diagrams may not necessarily need to be performed in the order presented, or may not necessarily need to be performed at all, according to some implementations.

These computer-executable program instructions may be loaded onto a special-purpose computer or other particular machine, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable storage media or memory that can direct a computer or other programmable data processing apparatus to function in a particular manner, such that the instructions stored in the computer-readable storage media produce an article of manufacture including instruction means that implement one or more functions specified in the flow diagram block or blocks. As an example, certain implementations may provide for a computer program product, comprising a computer-readable storage medium having a computer-readable program code or program instructions implemented therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language is not generally intended to imply that features, elements, and/or operations are in any way required for one or more implementations or that one or more implementations necessarily include logic for deciding, with or without user input or prompting, whether these features, elements, and/or operations are included or are to be performed in any particular implementation.

Many modifications and other implementations of the disclosure set forth herein will be apparent having the benefit of the teachings presented in the foregoing descriptions and the associated figures. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

What is claimed is:

1. One or more computer-readable media storing computer-executable instructions that, when executed by at least one processor, configure the at least one processor to perform operations comprising:
   determining an application executed by a rendering engine is to transition from a foreground state to a background state;
   generating a handler registration for the application;
   sending the handler registration to a notification module;
   setting the application to a background state;
   determining data associated with the application;
   determining one or more portions of the data which are eligible for compression;
   storing virtual memory addresses corresponding to the one or more portions of the data; and
   compressing the one or more portions of the data.

2. The computer-readable media of claim 1, wherein the rendering engine is configured to process hypertext markup language (HTML) version 5 and the application comprises a file comprising one or more HTML version 5 tags.

3. The computer-readable media of claim 1, wherein the data is eligible for compression when anonymous, unshared with another application, and above a pre-determined size threshold.

4. The computer-readable media of claim 1, wherein the one or more portions of the data eligible for compression omits a stack and omits a heap associated with the application.

5. The computer-readable media of claim 1, the determining the data associated with the application comprising retrieving a memory map configured to identify segments of memory allocated to a particular application executing in a virtual machine of the rendering engine.

6. The computer-readable media of claim 1, the operations further comprising:
   determining the application executing in the rendering engine is to transition from the background state to the foreground state;
   determining at least a portion of data associated with the application is compressed;

retrieving the virtual memory addresses corresponding to the data;
decompressing the data into the retrieved virtual memory addresses;
setting the application to the foreground state;
generating a handler deregistration for the application; and
sending the handler deregistration to the notification module.

7. One or more computer-readable media storing computer-executable instructions that, when executed by at least one processor, configure the at least one processor to perform operations comprising:
receiving indication of an application transition of an application from a first state to a second state, the application configured to execute within a rendering engine;
determining data associated with the application and stored in one or more portions of the computer-readable media which satisfies one or more compression criteria; and
compressing at least a portion of the data associated with the application.

8. The computer-readable media of claim 7, wherein the first state comprises a foreground state in which the application is active and the second state comprises a background state in which the application is dormant.

9. The computer-readable media of claim 7, wherein the application comprises a file comprising hypertext markup language (HTML) version 5 or greater tags and associated resources.

10. The computer-readable media of claim 7, wherein the application is executed within a virtual machine executed by a rendering engine.

11. The computer-readable media of claim 7, wherein the one or more compression criteria comprise when data is anonymous and unshared with another application.

12. The computer-readable media of claim 7, wherein the one or more compression criteria comprise the data excluding a stack and a heap associated with the application.

13. The computer-readable media of claim 7, the determining the data associated with the application comprising retrieving a memory map configured to identify segments of memory allocated to a particular application executing in a virtual machine.

14. The computer-readable media of claim 7, the operations further comprising storing virtual memory addresses corresponding to the data.

15. A system, comprising:
at least one memory storing computer-executable instructions, an application, and data; and
at least one processor configured to access the at least one memory and execute the computer-executable instructions to:
generate a handler registration associated with a state change in an application from a foreground state to a background state;
determine data stored in the at least one memory which is associated with the application;
determine one or more compressible portions of the data; and
compress the one or more compressible portions of the data.

16. The system of claim 15, the handler registration comprising an application identifier associated with the application.

17. The system of claim 15, the instructions further configured to provide the handler registration to a notification module configured to receive one or more notifications for the application while the one or more compressible portions of the data are compressed.

18. The system of claim 15, the instructions further configured to provide the handler registration to a notification module configured to poll for one or more notifications for the application while the one or more compressible portions of the data are compressed.

19. The system of claim 18, the notification module further configured to generate an event notification configured to initiate a state change in the application from the background state to a foreground state.

* * * * *